(12) United States Patent
Garabedian et al.

(10) Patent No.: US 7,264,984 B2
(45) Date of Patent: *Sep. 4, 2007

(54) PROCESS FOR FORMING MEMS

(75) Inventors: Raffi Garabedian, Monrovia, CA (US);
Salleh Ismail, Moorpark, CA (US);
Nim Hak Tea, Orange, CA (US);
Tseng-Yang Hsu, San Marino, CA (US); Melvin B Khoo, San Gabriel, CA (US); Weilong Tang, San Gabriel, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 330 days.

This patent is subject to a terminal disclaimer.

(21) Appl. No.: 11/019,912

(22) Filed: Dec. 21, 2004

(65) Prior Publication Data

US 2006/0134819 A1   Jun. 22, 2006

(51) Int. Cl.
H01L 21/44 (2006.01)
H01L 21/302 (2006.01)

(52) U.S. Cl. .................. 438/48; 438/622
(58) Field of Classification Search ........... 438/48–53; 216/2; 430/5, 312, 322; 205/118, 125
See application file for complete search history.

(56) References Cited

U.S. PATENT DOCUMENTS 5,190,637 A * 3/1993 Guckel .................. 205/118
2005/0048687 A1* 3/2005 Tatic-Lucic .............. 438/48
2006/0134820 A1* 6/2006 Tang et al. .............. 438/48

FOREIGN PATENT DOCUMENTS

EP           0567332 A2   10/1993
WO    WO 2004/056698 A2   7/2004

OTHER PUBLICATIONS

Jun-Bo Yoon et al., Monolithic Integration of 3-D Electroplated Microstructures With Unlimited Number of Levels Using Planarization With A Scarificial Metallic Mold (PSMM), pp. 624 thru 629.

* cited by examiner

Primary Examiner—Savitri Mulpuri
(74) Attorney, Agent, or Firm—Pillsbury Winthrop Shaw Pittman LLP

(57) ABSTRACT

The present invention relates to a process for forming microstructures on a substrate. A plating surface is applied to a substrate. A first layer of photoresist is applied on top of the plating base. The first layer of photoresist is exposed to radiation in a pattern to render the first layer of photoresist dissolvable in a first pattern. The dissolvable photoresist is removed and a first layer of primary metal is electroplated in the area where the first layer of photoresist was removed. The remainder of the photoresist is then removed and a second layer of photoresist is then applied over the plating base and first layer of primary metal. The second layer of photoresist is then exposed to a second pattern of radiation to render the photoresist dissolvable and the dissolvable photoresist is removed. The second pattern is an area that surrounds the primary structure, but it does not entail the entire substrate. Rather it is an island surrounding the primary metal. The exposed surface of the secondary metal is then machined down to a desired height of the primary metal. The secondary metal is then etched away.

36 Claims, 16 Drawing Sheets

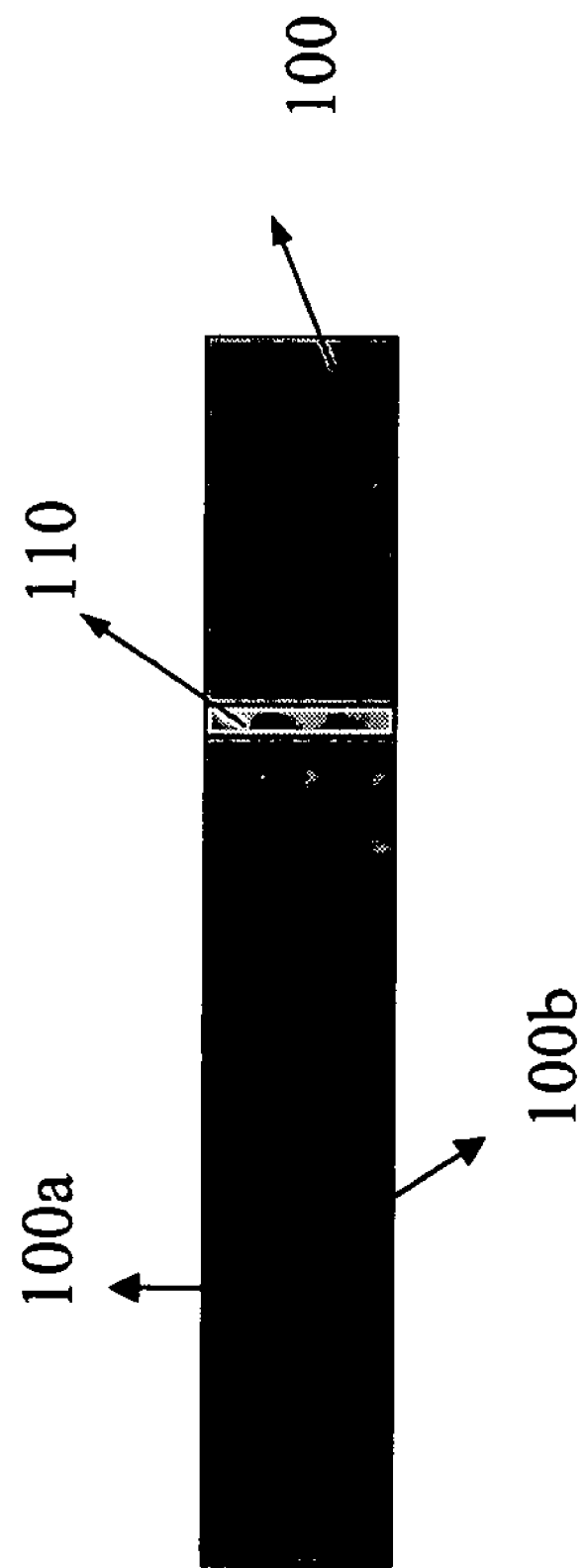

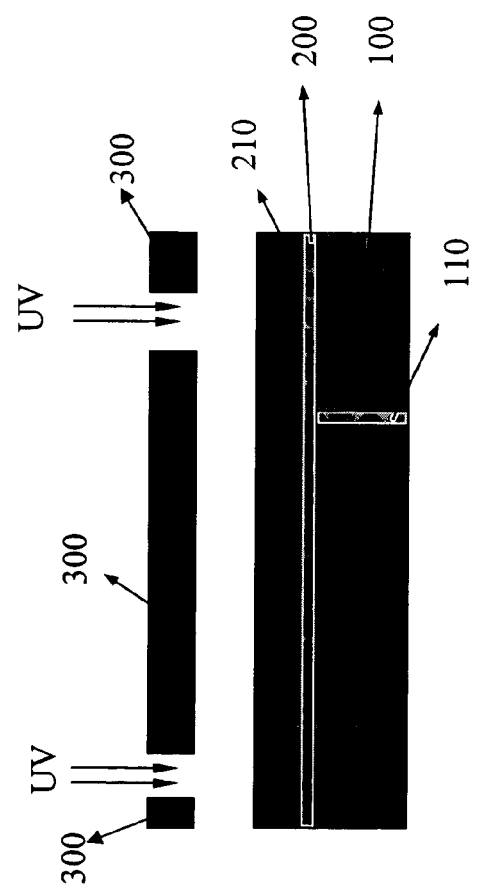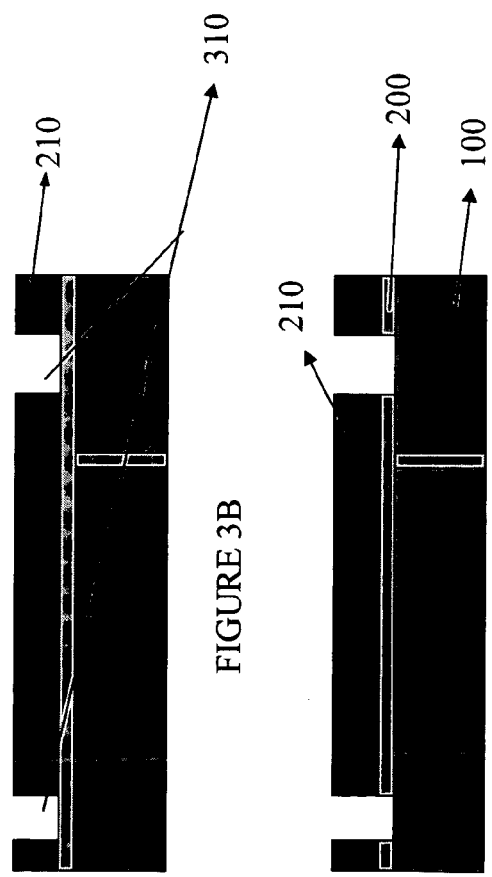

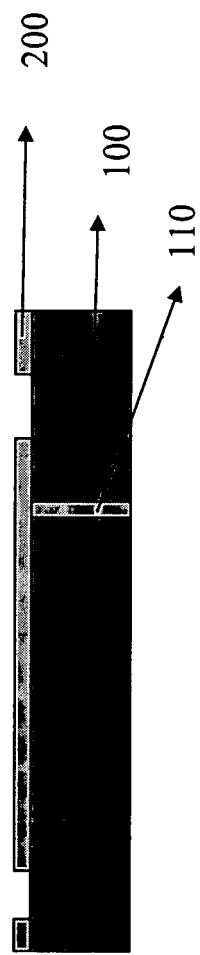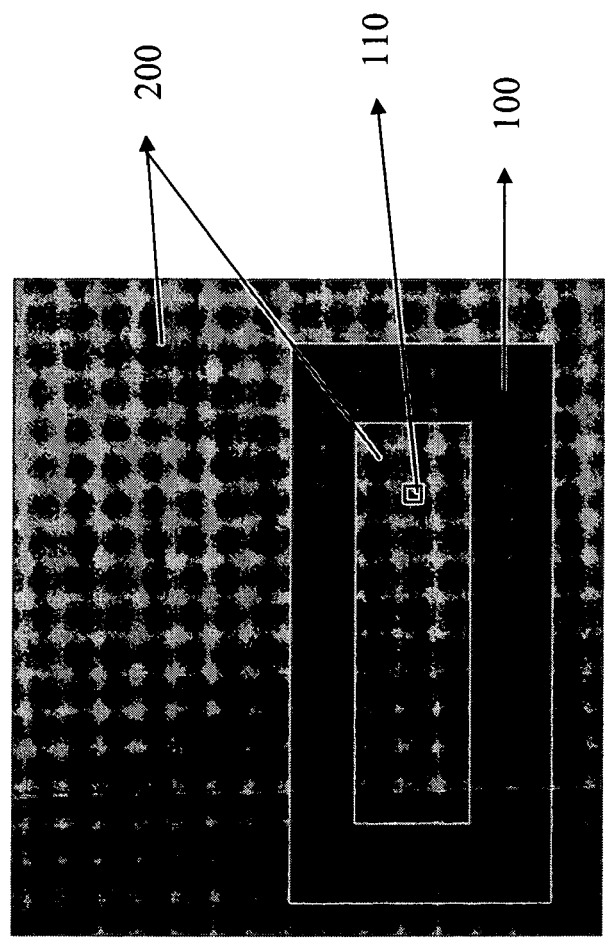
FIGURE 4A
FIGURE 4B

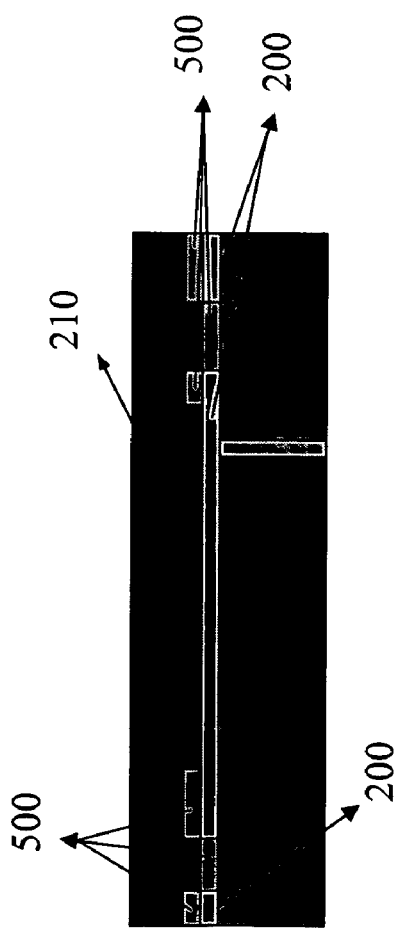
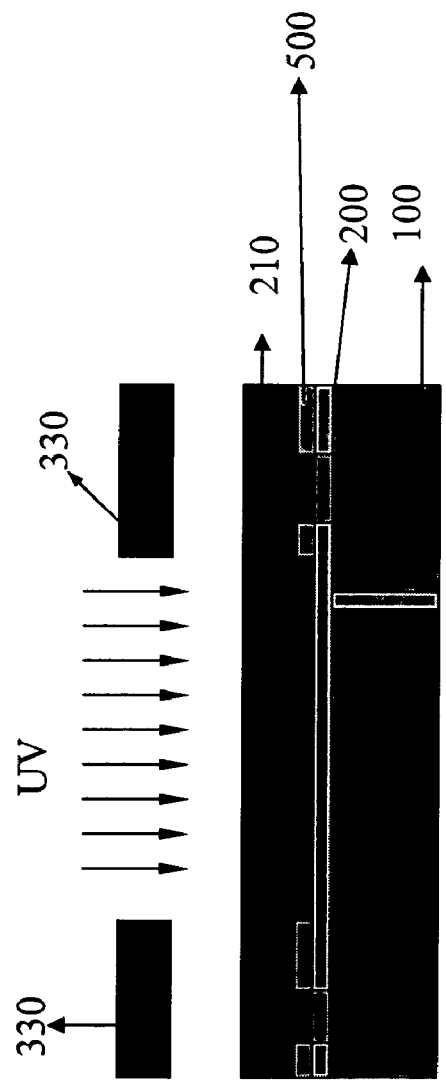
FIGURE 6A
FIGURE 6B

PROCESS FOR FORMING MEMS

BACKGROUND

The formation of micromechanical structures using photolithography and sacrificial layers is known in the art. The present invention is an improvement to the technology disclosed in U.S. Pat. No. 5,190,637 to Gluckel, titled "Formation of Microstructures by Multiple Level Deep X-ray Lithography with Sacrificial Metal Layers,"("the '637 patent"), which is incorporated herein by reference. In the '637 patent, microstructures are built in several steps. First a layer of photoresist capable of exposure by Radiation is applied to a plating base. The photoresist is then exposed to Radiation using a mask. The mask allows the Radiation to only "expose" a certain defined area of the photoresist. Subsequent developing removes photoresist selective to the exposure creating a cavity that replicates the plan of the exposure mask. The cavity formed in the photoresist is then filled by a primary metal that is electroplated on to an exposed plating base. The remaining photoresist is then removed and a secondary metal (a sacrificial metal) is electroplated over the entirety of the primary metal and plating base. The primary metal and the secondary metal are then machined by mechanical means down to a height which exposes the primary metal and planarizes the surface for subsequent processing. After machining, another layer of photoresist may be applied across both the primary and secondary metals, and then this photoresist is also patterned using the same procedures as above. After the primary metal has been electroplated into the cavity created in the photoresist, the rest of the photoresist is removed and the secondary metal is electroplated over the entirety of the first secondary metal, any exposed first primary metal and the newly added second primary metal. Both the second primary and second secondary metals are machined down to the desired thickness of the second layer of the primary metal and the process is repeated until the desired number of layers have been formed creating the desired microstructure in the primary metal. Once the microstructure has been formed, the entirety of the plating surface together with the primary and secondary metals are exposed to an etching agent that selectively etches away the secondary metal but not the primary metal, thus leaving only the primary metal and the plating surface.

The secondary metal is used instead of only using the photoresist because of the structural stability that it affords the primary metal during machining. Machining cannot generally be done through both the photoresist and the primary metal because the photoresist is relatively weak mechanically and may not adequately support the primary metal from damage due to the largely lateral forces encountered in the mechanical machining process (which may include machining, grinding, lapping, polishing, chemo-mechanical polishing, electric discharge machining, or any other commonly encountered machining process. Likewise, the photoresist may not be removed first before the machining of the primary metal because of the likelihood of substantial damage to the primary metal structure, such as the tearing or ripping off of portions of the structure that are not laterally supported. Finally, an added advantage the secondary metal affords is that it conveniently provides a conductive plating base for subsequent layers of primary metal that overhang underlying primary metal structures. Otherwise, the overhanging plating would require an additional thin film seed layer deposition step.

However, significant problems arise using this method when multiple or very laterally large microstructures are built on a single substrate, such as when manufacturing semiconductor testing probe heads. Plating the secondary metal across the entirety of the plating surface, for instance ceramic in the case of the probe heads, causes the plating base to bow and warp under the stress of the additional sacrificial metal. This causes two related problems: 1) it becomes difficult or impossible to machine the different layers to a uniform thickness and 2) it becomes difficult or impossible to perform the lithography because micro-lithography requires a planar surface.

Several different techniques have been used or suggested to address this problem, however, each has its deficiencies. Firstly, the use of secondary (sacrificial) metal with a controlled low stress has been attempted. Plated deposit stress can be controlled through the use of additives or through pulse-plating techniques. However, during subsequent processing, such as photoresist curing, the applied heat may cause the secondary metal to become "stressy" (meaning to apply film stress relative to the substrate) thus the warping is not prevented. Attempts have also been made to increase the thickness of the substrate, knowing that the stress which the substrate can withstand increases with the thickness. However, the thickness of the substrate necessary to withstand the stress of the secondary metal may be impractical. Additionally, the film stress (which is most often, though not necessarily, tensile in nature) causes mechanical failure at or near the substrate/metal interface, including both delamination and bulk fracture of the ceramic.

Thus, what is needed is a process for creating micromechanical and micro electro-mechanical system structures, such that multiple or large structures may be built on the same substrate, without the substrate warping.

SUMMARY OF THE INVENTION

The present invention solves the above-described deficiencies by providing that the secondary metal is not plated over the entirety of the substrate's structured area. Instead the secondary metal is only plated in an area immediately surrounding the primary metal structure so that it lends its structural stability to the primary metal structure, but does not cause undue stress on the substrate. The present invention creates "islands" of secondary (sacrificial) metal, where it is needed for mechanical stability and the creation of structural overhangs instead of requiring the secondary metal to be formed in the entire area encompassing all structural metal regions on the substrate.

In the present invention, a photoresist is applied to a plating surface. A portion of the photoresist is then removed to form a cavity by the use of a mask. The cavity formed in the photoresist is then filled with a primary metal which is electroplated on to the plating surface. The remainder of the photoresist is then removed and another layer of photoresist is applied to the substrate and primary metal structure. A portion of that photoresist is then dissolved only in the area including the primary metal structure(s) and the area where a secondary metal island is to be formed. The island may contain only the area immediately surrounding the primary metal structure such as is adequate to provide mechanical stability during subsequent machining or it may encompass a much larger area but one that is less in extent than the entire substrate area. The secondary (sacrificial) metal is then electroplated into the cavities created around the primary metal structure(s) and atop the primary metal structure itself. This prevents the plating of the secondary metal across the entirety of the substrate which is the source of undue stress that causes warping of the substrate. The entirety of the photoresist, secondary metal, and primary metal may then be machined down to the desired thickness, flat and exposing the primary metal, and a subsequent layer may then be built atop this first layer using the same method.

Once the entirety of the primary metal structure has been created, the remainder of the photoresist may be stripped away, and the secondary metal may be removed using an etching agent to selectively etch away the secondary metal, but not the primary metal.

It should be understood that wherever the term "primary metal" is used, it is intended that any number of structural materials may be incorporated to selectively supply desired properties to a given primary metal layer such as strength, hardness, toughness, ductility, electrical contact characteristics, electrical or dielectric properties, etc. The fundamental criteria for a "primary metal" is that it be electroformable suitable for incorporation in the final microstructure, and that it not be attacked or substantially damaged during subsequent removal of the secondary metal. This is to say that it may be possible for a "primary metal" to be one type of metal in a first layer, and a second type of metal in a second layer. The "primary metal" for a given layer may be selected from the list including metals, metal alloys, plated metal composites such as those combining plated metals and fine dielectric particles such as diamond, micro-layered metal co-deposits, electrophoretic polymers, conductive polymers, electrophoretic or electroformable ceramics and glasses.

BRIEF DESCRIPTION OF THE DRAWINGS

FIGS. 1-16 are schematic views illustrating steps of an embodiment of the process of the invention for forming a multi-layer structure fixed to a substrate.

FIG. 4B illustrates a top-down view of FIG. 4A.

FIG. 16 illustrates a top-down view of FIG. 14B

DETAILED DESCRIPTION

FIG. 1 shows a starting material on which to build the microstructure. The substrate 100 may be any type of substrate, including semiconductors such as silicon, germanium and gallium arsenide, ceramics such as alumina, aluminum, nitride low temperature cofired ceramics (LTCC) and high temperature cofired ceramics (HTCC), metals or glasses. In an embodiment of the present invention, microstructures such as springs used in testing semiconductor devices may be built on the substrate 100. In that case, the substrate 100 may be a Low Temperature Co-fired Ceramic (LTCC) substrate with built in vias 110 such that electricity may be conducted from one face 100a of the substrate 100 to the other face 100b of the substrate 100 by way of the vias 110. In an embodiment of the present invention, the vias 110 are made from gold, but any other conductor such as copper or platinum may be used. The ceramic may also contain electrical redistribution conductors, making it an electrical "space transformer" as is commonly known in the art.

Figure 2A:
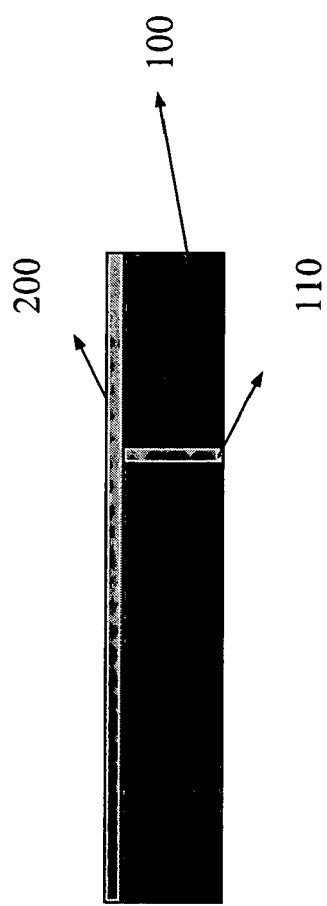

In an embodiment of the present invention, a plating surface 200 may be applied to one face 110a of the substrate 100 as shown in FIG. 2A. One such example of a plating surface is a Cr/Au seed layer 200. The Cr/Au seed layer 200 is the conductive adhesion layer and plating seed for the primary metal 700 (shown in FIG. 7B) that will form the microstructure to be electroplated on at a later time. The Cr/Au seed layer 200 may be deposited on the substrate 100 by use of a sputtering machine, or the seed layer 200 may be e-beam evaporated, spincoated conductive polymer, or electroless plated. The seed layer may be any of the commonly known materials and material combinations such as Cr under Au, Ti under Cu, Ti—W under Au, etc. While in some embodiments, the substrate 100 may not have a via 110 (for instance for building microstructures which do not need to be electrically connected to or through the substrate), if vias 110 are present in the substrate 100, it is preferable that the seed layer 200 be electrically coupled to the vias 110 such that structures built on top of the seed layer 200 may conduct electrical signals through the substrate 100. The seed layer 200 is usually fairly thin and may be applied in a composition of 300 A of Cr and 2000 A of Au, although other compositions and thicknesses may be used in different amounts without departing from the spirit of this invention. If the substrate is made of metal, a plating base may not be necessary, as the metal may constitute the plating base. Additionally, structures such as dielectric films and interconnect stacks including conductors and dielectric films may lie between the substrate and the plating seed without departing from the spirit of the present invention.

Figure 2B:
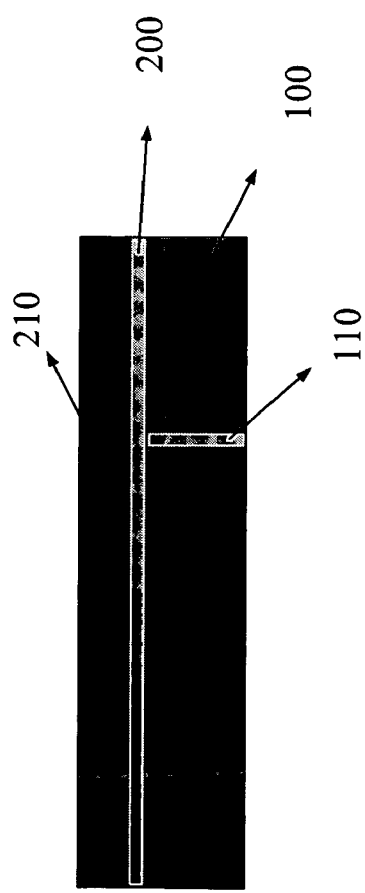

In FIG. 2B, the first layer of photoresist 210 is applied on top of the seed layer 200. The photoresist 210 is a photo-patternable polymer. The photoresist 210 may be positive or negative photoresist. For positive resists, the resist is exposed to a certain type of radiation wherever the resist is to be removed. In these types of resists, the radiation changes the chemical structure of the resist so that it becomes more soluble in a developer. The exposed resist is then washed away by the developer solution, leaving only the resist that was not exposed to the radiation. Negative resists behave in an opposite manner. Exposure to the radiation changes the chemical structure of the resist so that it becomes more difficult to dissolve. Different types of photoresist may be utilized including photoresist which is capable of chemical structural change in the presence of visible light, x-rays, ultraviolet light, direct write e-beam exposure or other forms of radiation. In one embodiment of the present invention, a photoresist such as one produced by Shipley Electronic Materials, such as model number 1518 or 4620, is spun onto the seed layer 200. Other types of photoresists 210, such as polymethylmethacrylate (PMMA), Polyimide, SU8 or Shipley BPR 100 may be also be used. The photoresist 210 may be applied to the seed layer in many different fashions including spinning, electroplating, spray coating, a laminated dry-film process or patterned plated. After the photoresist 210 is spun, it is often times oven or hot-plate baked in order to drive off solvents and/or harden the photoresist 210.

FIG. 3A illustrates the use of a mask 300 to form a cavity in positive photoresist 210 (although negative photoresist may also be used if the mask is inverted). The form of radiation beams down upon the mask 300 in the direction of the arrows marked UV, and passes through the mask 300 wherever the mask 300 has been modified to allow passage of the radiation. The photoresist 210 is dissolved in the locations directly below the areas where the mask 300 has been modified, creating the cavities 310 as shown in FIG. 3B. A mask 300 may be fashioned from anything that is capable of blocking the form of radiation that will otherwise expose the photoresist 210. For instance, if ultraviolet light is used to expose the photoresist 210, then the mask 300 must be capable of blocking ultraviolet light except in the locations where it has been modified to allow the ultraviolet light to pass. The mask 300 may be modified in numerous different ways to allow the radiation to pass through in select locations. For instance, if the mask 300 is intended to block ultraviolet light, then mask 300 may consist of a glass plate with a thin film having UV blocking properties applied to it. The tint may then be etched off in the locations where the photoresist 210 is intended to be exposed. Numerous other ways of creating the same effect may be utilized.

If the process is being used to create microstructures that are to be electrically isolated from each other, yet reside on the same substrate 100, then the seed layer 200 may be etched in locations on the sides of the microstructure as is shown in FIG. 3C. For instance, this may be the case when forming a multitude of contacts for contacting semiconductors under testing situations. The etching may be accomplished using dry etching techniques such as ion milling or sputtering etch or a wet etch may also be used. For instance, in the case of the use of a Cr/Au seed layer, a wet etch consisting of a gold etch, such as iodine salt base etchant, may be followed by a commercial chrome etch. The seed layer may also be patterned by shadow masking or lift-off processes. Once the seed layer 210 has been etched, the remainder of the photoresist 210 may be removed as in FIG. 4A by any of the methods know in the art (including but not limited to dry etching techniques such as oxygen plasma or reactive ion etching, laser assisted etching, ablation, or by wet etch techniques such as those using acetone, methanol, IPA, acid strippers like Piranha or other solvents and strippers commonly known in the art. FIG. 4B is a top down view of FIG. 4A. The structure in FIGS. 4A and 4B is the beginning of a structure which is electrically isolated from other structures, but which is capable of transmitting electrical signals from one face of the substrate 100 to the other, utilizing the via 110.

Figure 5A:
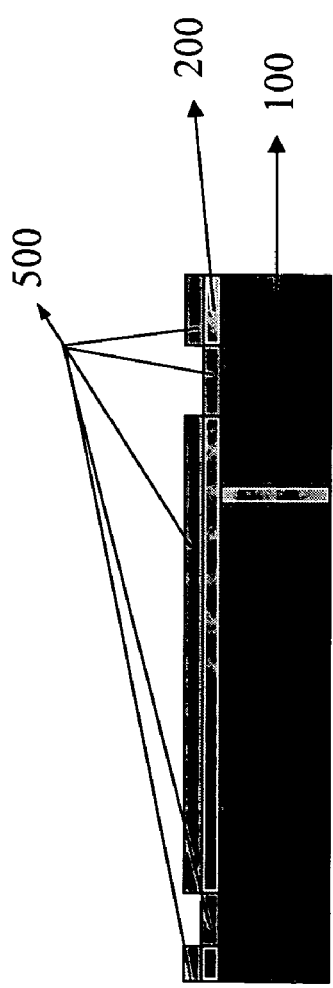
Figure 5B:
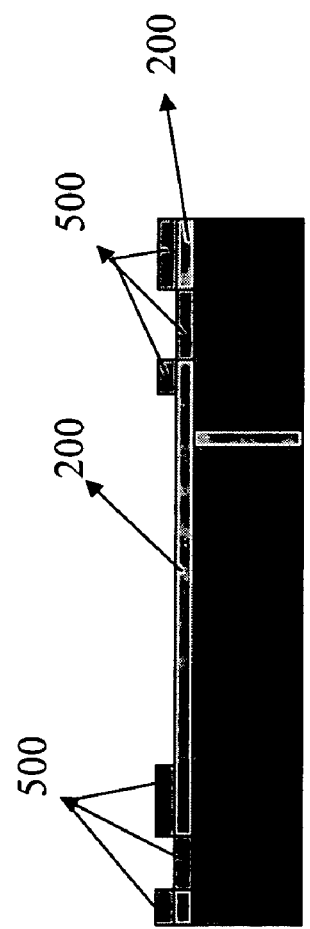

In an embodiment of the present invention where the microstructure must be capable of electrically conducting signals to the via 110, yet must be electrically isolated from other structures, a second seed layer 500 may be applied to substrate 100 (in the locations where the first seed layer 200 has been etched away) and over the first seed layer 200 so that the secondary (sacrificial) metal 800 may have an electrical connection on which to be electroplated, as shown in FIG. 5A. Preferably, this second seed layer 500 is of a different composition than the first seed layer 200, such that it may be etched away without etching away the first seed layer 210. In an embodiment, a second seed layer 500 of 300 A of Ti and 2000 A of Cu may be sputtered across the substrate 100 and first seed layer 200. The second seed layer 500 may be fashioned from many other compositions while maintaining the spirit of this invention. If a second seed layer 500 is used, then a portion of the second seed layer 500 will be removed so that the primary metal 700 forming the microstructure may have direct contact with the first seed layer 210. This may be done in the same fashion as shown in FIGS. 2B-4A. It should be understood that in embodiments where either the primary metal 700 structure does not need to be electrically connected to the substrate 100, for instance, microstructures which are in their final form that will not be connected to the substrate 100, or in cases where the primary metal 700 structures do not need to be electrically isolated from one another, a second seed layer 500 may not be necessary and the first seed layer may not need to be patterned.

Figure 7A:
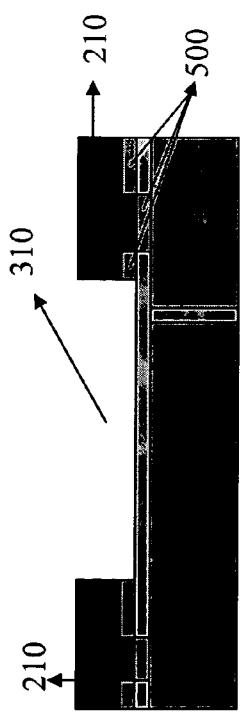

Once the plating base(s) have been formed, the primary metal 700 structures are ready to be formed. In FIG. 6A, photoresist 210 is applied on top of the first 200 and second 500 seed layers (if the second seed layer 500 is indeed present). This photoresist 210 may be the same photoresist applied in FIG. 2B or it may be a different photoresist depending on the thickness required for the layer, the polarity of the pattern (negative or positive) or any other material characteristic. The photoresist 210 is then exposed using a mask 330 such that a cavity 310 is formed in the photoresist 210 in the shape that a first layer of the microstructure is to take as shown on FIGS. 6B and 7A. While different reference numerals are used to indicate that masks used throughout the process may have different patterns, it is to be understood that one or more of the masks 300, 330, 340, 350 could possibly have the same pattern as another mask.

Figure 7B:
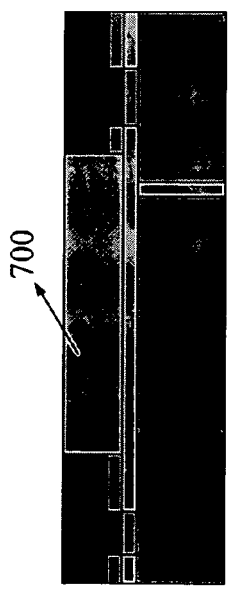
Figure 7C:
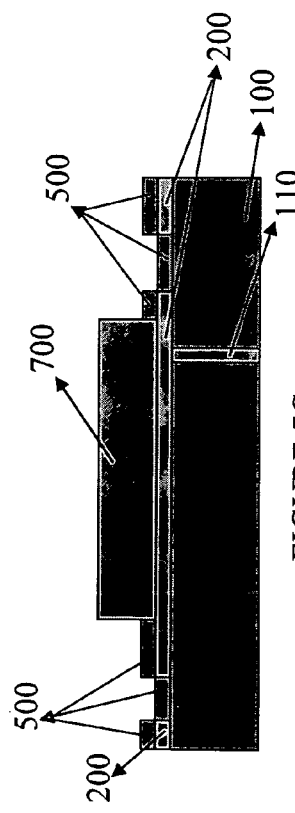

Once the cavity 310 is exposed in the photoresist 210, a primary metal 700 that will be used to form the microstructure may be electroplated into the cavity 310 as shown in FIG. 7B. The primary metal 700 may be of any type of metal, for instance an alloy of Ni—Mn may be electroplated into the cavity 310 in the amount of 20-25 μm. Because the primary metal 700 must be lapped and polished in order to planarize the layer and achieve a uniform controlled thickness, the primary metal 700 is generally plated slightly thicker than the layer's desired final thickness. The rest of the photoresist 210 is then removed in the fashion mentioned above as shown in FIG. 7C.

Figure 8A:
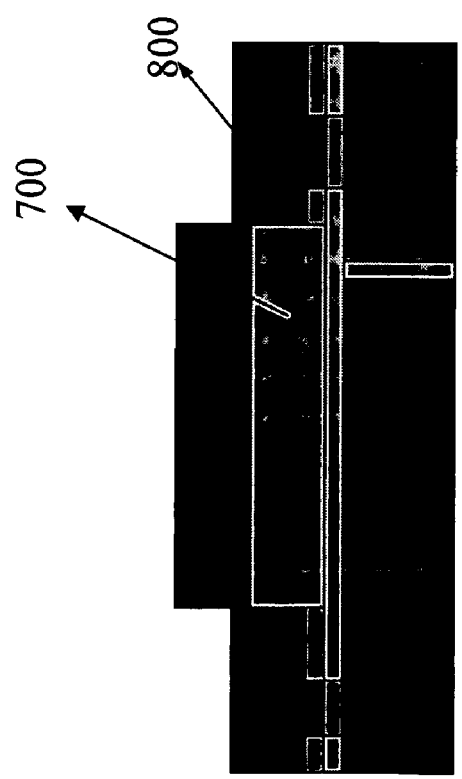
Figure 8B:
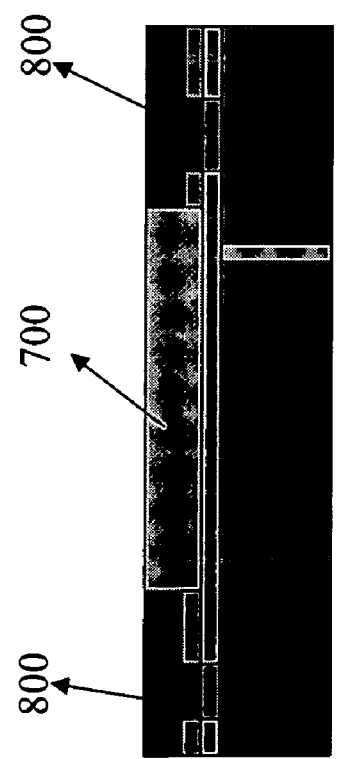

Now the secondary (sacrificial) metal 800 is electroplated onto the secondary seed layer 500 (if different than the primary seed layer) and the primary metal 700 as shown in FIG. 8A. The secondary metal 800 may be any electrodepositable metal that may be selectively etched or removed without substantially effecting the primary metal 700. Completely covering the first layer of the primary metal 700 with the secondary metal 800 facilitates machining of the surface of both the primary 700 and secondary metals 800 because of the mechanical stability which the secondary metal 800 provides to the primary metal 700. The photoresist 210 is relatively weak mechanically and thus if it was the only thing that remained around the primary metal 700, the photoresist 210 could rip and tear as it is being machined (thus, not providing a smooth, regular planar structure), nor is the photoresist 210 capable of providing the horizontal support to the primary metal 700 that is needed during machining. Furthermore, if one attempted to machine the isolated primary metal 700 structure without anything surrounding it, one would risk substantial damage to the often fragile primary metal 700 structure such as ripping off portions of the primary metal 700 structure. Finally, an added advantage the secondary metal affords is that it conveniently provides a conductive plating base for subsequent layers of primary metal that overhang underlying primary metal structures. Otherwise, the overhanging plating would require an additional thin film seed layer deposition step. In one embodiment, the secondary metal 700 may be Cu and may be electroplated to a thickness equal to or slightly (a few to a few tens of microns) greater than that of the primary metal 700. FIG. 8B shows the structure of FIG. 8A after the unit has been lapped and polished such that the primary metal 700 is at a desired thickness.

As shown in FIGS. 8A and 8B, the first layer (or first couple of layers) of secondary metal 800 may be plated across the entire substrate. However, the layers of secondary metal 800 that are plated across the entire substrate must not to be so thick or so numerous that they cause any non-negligible amount of warpage of the substrate. It is important to note that the majority of secondary metal 800 layers are not plated across the entire substrate, but rather are only plated in areas surrounding the primary metal 700 structure and any subsequent (higher layer) primary metal structures such that they add the mechanical stability to the primary metal 700 structure needed during the lapping and polishing (machining) and provide a plating base for subsequent overhanging layers. This is shown more clearly in FIGS. 12B-14B. The additional stress that is added to a substrate 100 when secondary metal 800 is plated across the entire length of the substrate 100 (other than as noted above) has been shown to warp the substrate 100. The warpage of the substrate 100 makes it difficult or impossible to planarize it to a uniform height. However, planarization is required for lithography and subsequent machining and thus is unacceptable when building several (or large) microstructures on the same substrate 100. Thus, the majority of the secondary metal 800 layers should only be plated to a length and thickness such that it adds the structural stability to the primary metal 700 structure, but not much more. In an embodiment of the present invention, the secondary metal 800 is plated in a region that covers 80% of the substrate 100 (The secondary metal 800 does not technically touch the substrate because the substrate is technically already covered by a plating base(s)) In an embodiment of the present invention, the secondary metal 800 is plated in a region that covers 50% of the substrate 100. In an embodiment of the present invention, the secondary metal 800 is plated in a region that covers 30% of the substrate 100. In an embodiment of the present invention, the secondary metal 800 is plated in a region that covers 10% of the substrate 100. In an embodiment of the present invention, the area of the region in which the secondary metal 800 is plated is six times the area of the layer of the primary metal 700. In an embodiment of the present invention, the area of the region in which the secondary metal 800 is plated is four times the area of the layer of the primary metal 700. In an embodiment of the present invention, the area of the region in which the secondary metal 800 is plated is ten times the area of the layer of the primary metal 700. In an embodiment of the present invention, the region in which the secondary metal 800 is plated surrounds the primary metal and the thickness of is greater than 1x, but less than 2x, the thickness of the layer of the primary metal 700.

Figure 9A:
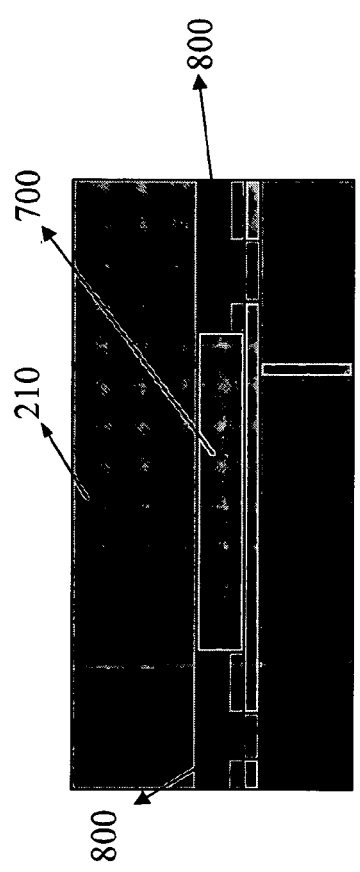
Figure 9B:
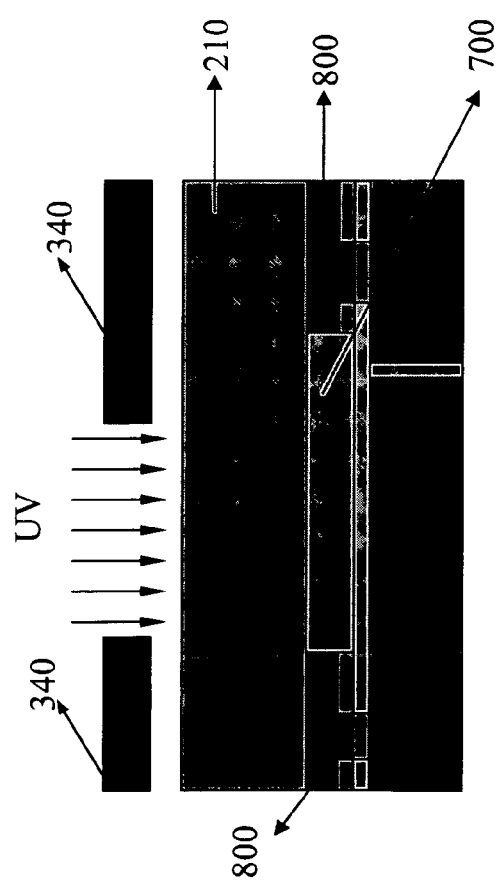
Figure 10A:
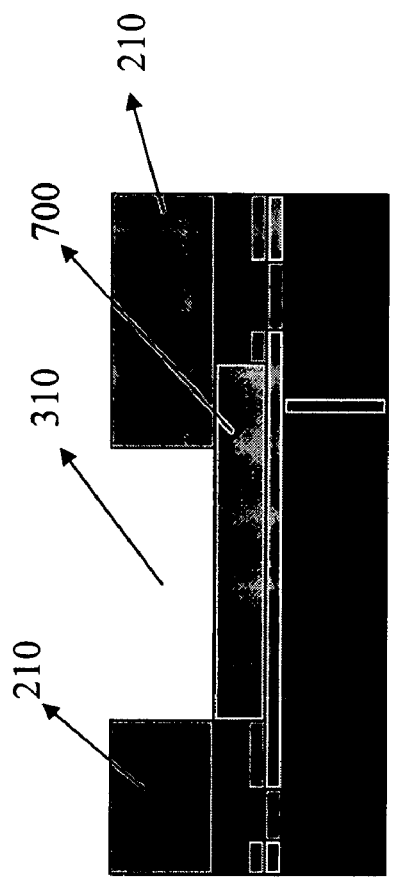
Figure 10B:
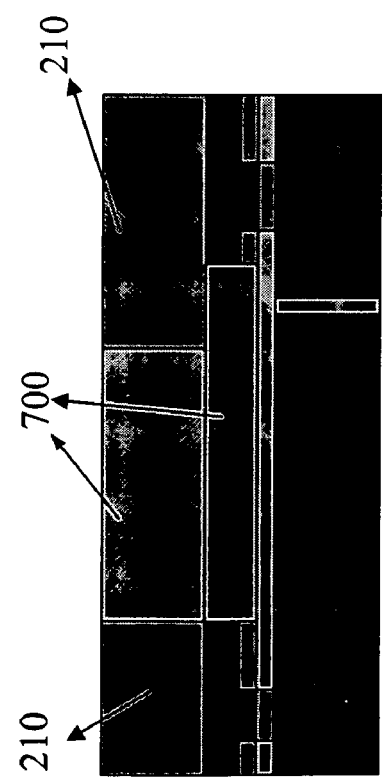
Figure 11A:
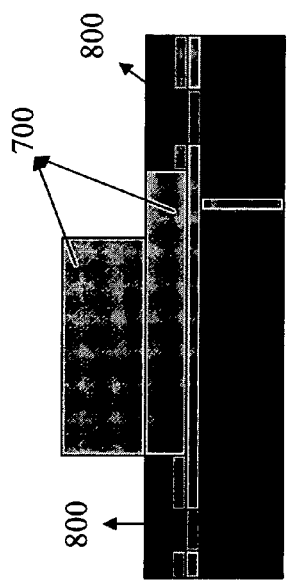
Figure 11B:
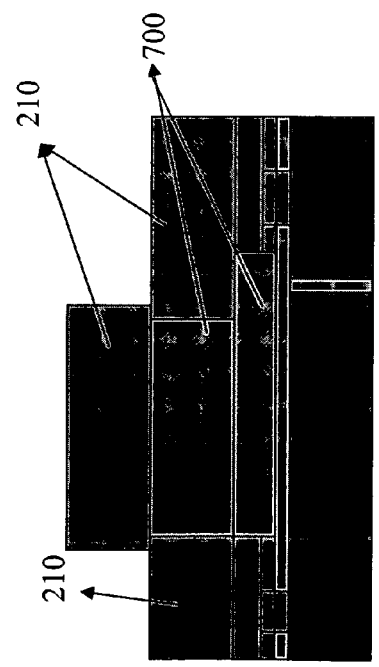
Figure 12A:
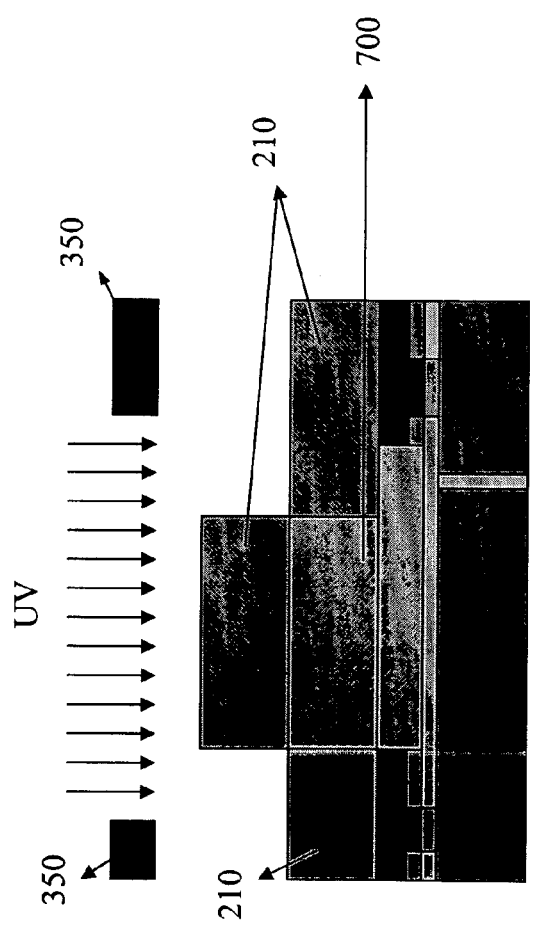
Figure 12B:
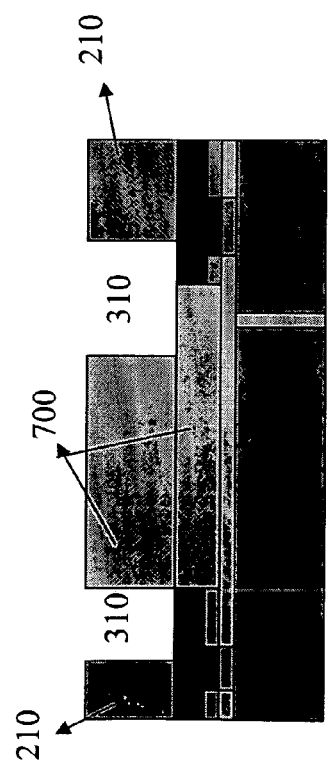
Figure 13A:
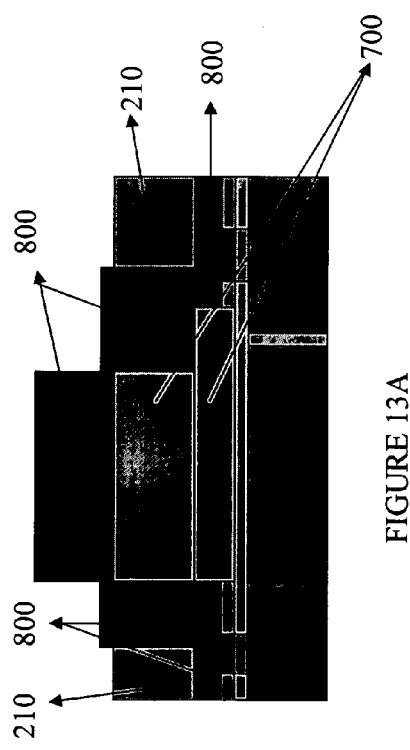
Figure 13B:
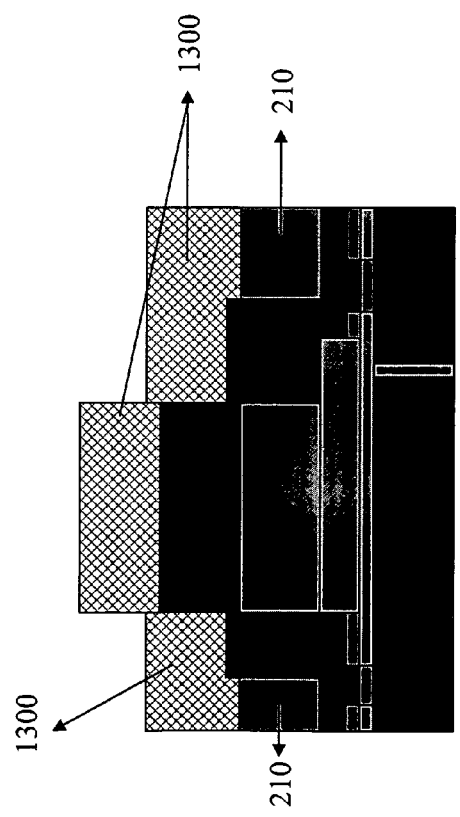
Figure 14A:
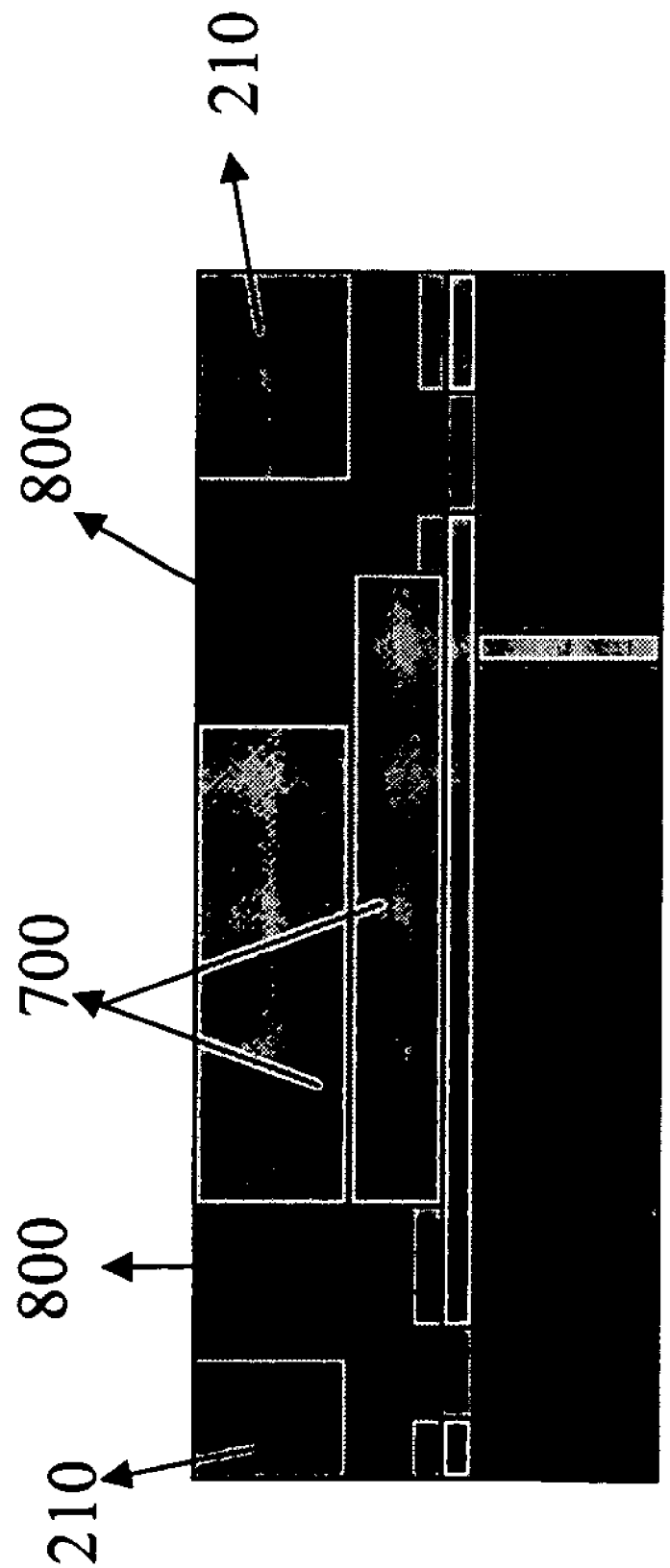

In FIG. 9A, more photoresist 210 is spun on top of the planarized primary 700 and secondary 800 metals of the unit. A mask 340 is used again to pattern the photoresist 210 in the desired fashion to create a cavity 310 for the next layer of the primary metal 700 as shown in FIGS. 9B and 10A. The primary metal 700 is then electroplated into the cavity 310 as shown in FIG. 10B. In FIG. 11A, the rest of the photoresist 210 is removed and in FIG. 11B, an entire new layer of photoresist 210 is deposited.

Figure 16:
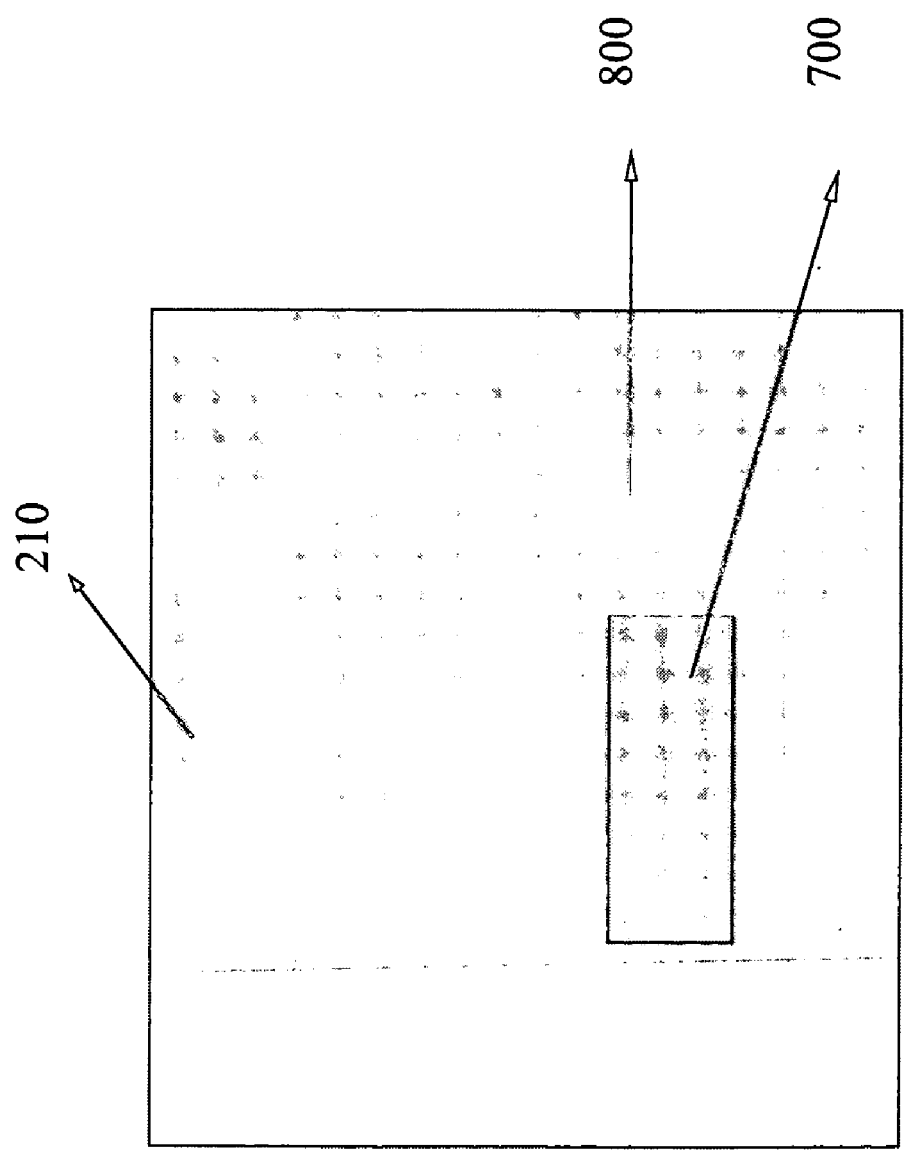

A mask 350 is again used to pattern an area immediately surrounding the primary metal 700 structure so that the secondary metal 800 may be electroplated into the cavities 310 according to the guidelines outlined above, i.e., not across the entire substrate 100 as shown in FIGS. 12A-13A. Depending on the number of primary metal 700 structures being formed on the substrate 100, there may be many of these secondary metal 800 "islands". In FIGS. 13B-14A, a layer of polymer (photoresist, epoxy, PMMA, phenolic resin, polyurethane, or other appropriate low stress filler material) 1300 is applied on top of the secondary metal 800, hardened, and then the unit is machined to the desired thickness of the second layer of the primary metal 700 structure. This polymer 1300 layer is a "filler" layer ensuring that during and after machining, a planar and continuous surface is presented for subsequent layer processing. FIG. 16 is a top-down view of the FIG. 14A. It is permissible to use a polymer 1300 surrounding the secondary metal 800 during the machining process (but not surrounding the primary metal 700) because the tolerance for planarity around the secondary metal 800 is increased.

Figure 15A:
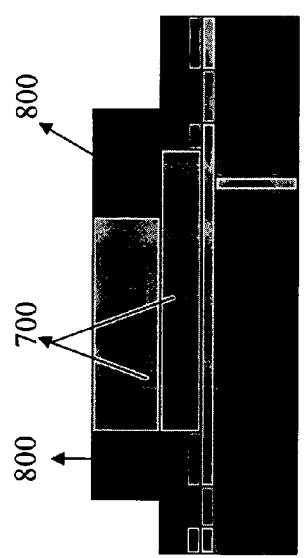
Figure 15B:
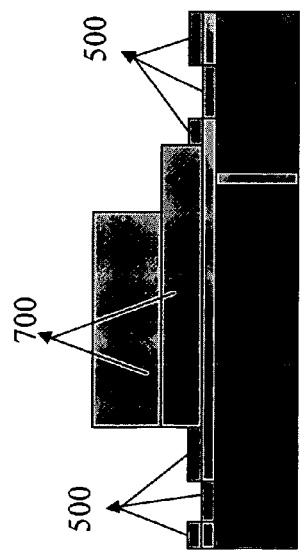
Figure 15C:
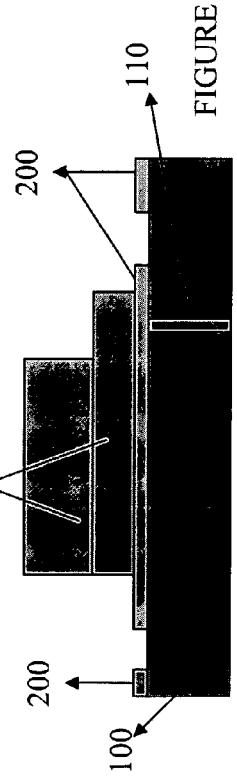

The process steps of FIGS. 9A-14A may be repeated until the primary metal 700 structure is in its final form. At that point, whatever is left of the photoresist and/or polymer 210/1300 is stripped away as shown in FIG. 15A. Next the secondary metal 800 is etched away using an etching agent that will not substantially etch or otherwise damage the primary metal 700 or the first seed layer 200, as shown in FIG. 15B. After that, the secondary seed layer 500 (if present) may be etched away, also using an etching agent which will not substantially etch or damage the primary metal 700 or first seed layer 200, leaving only the primary metal 700 structure and the first seed layer 200 on the substrate 100 as shown in FIG. 15C. If the primary metal 700 structure is not intended to be attached to the substrate 100, then the first seed layer 200 may also be etched away using an etching agent that will not substantially effect the primary metal 700 structure.

In an embodiment of the present invention, the structure formed of the primary metal 700 is a micro-machined spring that is used in conjunction with a probe card assembly to test semiconductor devices such as those built by Integrated Micromachines Inc. of Irwindale, Calif. or those built by Form Factor of Livermore, Calif. In cases where the structure formed is a micro-machined spring, many micro-machined springs may be built on a single substrate using this process such that many springs may contact a wafer of semiconductor chips at one time. Using the process presented herein allows for micro-machined springs to be built over a larger area of a single substrate and at a substantially reduced cost then current processes known in the art.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein.

What is claimed is:

1. A process for forming a micromechanical structure comprising:
   providing a plating base on a surface of a substrate;
   forming a first photoresist layer on the plating base;
   exposing the first photoresist layer to a first pattern of radiation to render the first photoresist layer dissolvable in a first pattern;
   removing the dissolvable photoresist of the first photoresist layer;
   electroplating a layer of primary metal onto the plating base in the area where the first photoresist layer has been removed;
   removing the remainder of the first photoresist layer;
   forming a second photoresist layer over the plating base and the layer of primary metal;
   exposing the second photoresist layer to a second pattern of radiation to render the second photoresist layer dissolvable in a second pattern, the second pattern being formed such that an area surrounding the primary metal is dissolved, wherein the area is less than the entirety of the substrate;

removing the dissolvable photoresist of the second photoresist layer;

electroplating an amount of secondary metal in the area where the second photoresist layer has been removed;

machining the exposed surface of the secondary metal down to a substantially flat surface corresponding to a desired height of the layer of primary metal;

removing the remainder of the photoresist of the second photoresist layer; and etching away the remainder of the secondary metal.

2. The process of claim 1, wherein the secondary metal is capable of being etched without substantially etching the primary metal.

3. The process of claim 1, wherein the amount of secondary metal electroplated provides horizontal mechanical stability to the primary metal.

4. The process of claim 1, wherein the primary metal is electroplated to a height greater than a desired height of the primary metal.

5. The process of claim 1 or 4, wherein the secondary metal is electroplated to a height greater than a height of the electroplated primary metal.

6. The process of claim 1, wherein the primary metal is a Ni-Mn alloy.

7. The process of claim 1 or 6, wherein the secondary metal is Cu.

8. The process of claim 1, wherein the photoresist is positive photoresist.

9. The process of claim 1, wherein the photoresist is negative photoresist.

10. The process of claim 1, wherein the radiation is ultraviolet light.

11. The process of claim 1, further including etching away the plating base.

12. A process of forming a micromechanical electrical structure comprising:

depositing a first seed layer on a substrate;

depositing a first photoresist layer on the first seed layer;

exposing the first photoresist layer to a first pattern of radiation to render the first photoresist layer dissolvable in a first pattern;

removing the dissolvable photoresist of the first photoresist layer;

removing a portion of the first seed layer in the area where the first photoresist layer has been removed;

removing the remainder of the first photoresist layer;

depositing a second seed layer on the substrate and first seed layer;

depositing a second photoresist layer on the exposed surfaces of the first seed layer and the exposed surface of the second seed layer;

exposing the second photoresist layer to a second pattern of radiation to render the second photoresist layer dissolvable in a second pattern;

removing the dissolvable photoresist of the second photoresist layer;

etching away a portion of the second seed layer in the area where the second photoresist layer has been dissolved;

electroplating a layer of primary metal across the plating base in the area where the second photoresist layer has been removed;

removing the remainder of the second photoresist layer;

applying a third photoresist layer across the second seed layer and the layer of primary metal;

exposing the third photoresist layer to a third pattern of radiation to render the third photoresist layer dissolvable in a third pattern, the third pattern being formed such that an area surrounding the primary metal is dissolved, wherein the area is less than the entirety of the substrate;

electroplating an amount of secondary metal in the area where the third photoresist layer has been removed;

machining the exposed surface of the secondary metal down to a substantially flat surface corresponding to a desired height of the layer of primary metal;

removing the remainder of the photoresist of the third photoresist layer;

etching away the remainder of the secondary metal; and etching away the second seed layer.

13. The process of claim 12, wherein the substrate includes a via that allows electrical signals to pass from a first face of the substrate to a second face.

14. The process of claim 12, wherein the secondary metal is capable of being etched without substantially etching the primary metal.

15. The process of claim 12, wherein the amount of secondary metal electroplated is only an amount such that it provides horizontal mechanical stability to the layer of primary metal.

16. The process of claim 12, wherein the layer of primary metal is electroplated to a height greater than the desired height of the layer of primary metal.

17. The process of claim 12 or 16, wherein the secondary metal is electroplated to a height greater than a height of the electroplated layer of primary metal.

18. The process of claim 12, wherein the primary metal is a Ni-Mn alloy.

19. The process of claim 12 or 18, wherein the secondary metal is Cu.

20. The process of claim 12, wherein the photoresist is positive photoresist.

21. The process of claim 12, wherein the photoresist is negative photoresist.

22. The process of claim 12, wherein the radiation is ultraviolet light.

23. A process for forming a micromechanical structure comprising:

providing a plating base on a surface of a substrate;

forming a first photoresist layer on the plating base;

exposing the first photoresist layer to a first pattern of radiation to render the first photoresist layer dissolvable in a first pattern;

removing the dissolvable photoresist of the first photoresist layer;

electroplating a layer of primary metal onto the plating base in the area where the first photoresist layer has been removed;

removing the remainder of the first photoresist layer;

forming a second photoresist layer over the plating base and the layer of primary metal;

exposing the second photoresist layer to a second pattern of radiation to render the second photoresist layer dissolvable in a second pattern, the second pattern being formed such that an area surrounding the primary metal is dissolved, wherein the area is less than the entirety of the substrate;

removing the dissolvable photoresist of the second photoresist layer;

electroplating an amount of secondary metal in the area where the second photoresist layer has been removed;

forming a layer of polymer over substantially the entire length of the substrate;

machining the polymer, the secondary metal, and the primary metal down to a substantially flat surface corresponding to a desired height of the layer of primary metal;

removing the remainder of the photoresist of the second photoresist layer; and etching away the remainder of the secondary metal.

24. The process of claim 1, wherein the secondary metal is etched away without substantially etching the primary metal.

25. The process of claim 1, wherein the amount of secondary metal electroplated provides horizontal mechanical stability to the primary metal.

26. The process of claim 1, wherein the primary metal is electroplated to a height greater than a desired height of the primary metal.

27. The process of claim 1 or 4, wherein the secondary metal is electroplated to a height greater than a height of the electroplated primary metal.

28. The process of claim 1, wherein the primary metal is a Ni-Mn alloy.

29. The process of claim 1 or 6, wherein the secondary metal is Cu.

30. The process of claim 1, wherein the photoresist is positive photoresist.

31. The process of claim 1, wherein the photoresist is negative photoresist.

32. The process of claim 1, wherein the radiation is ultraviolet light.

33. The process of claim 1, further including etching away the plating base.

34. The process of claim 1, wherein the polymer is a low stress polymer.

35. The process of claim 1, wherein the polymer is one of epoxy, PMMA, phenolic resin, or polyurethane.

36. The process of claim 1, wherein the removing the remainder of the photoresist of the second photoresist layer is done before the forming of the layer of polymer.

* * * * *